(12) United States Patent
Agam et al.

(10) Patent No.: US 7,405,446 B2
(45) Date of Patent: Jul. 29, 2008

(54) ELECTROSTATIC PROTECTION SYSTEMS AND METHODS

(75) Inventors: Moshe Agam, Portland, OR (US); Rick Smoak, Portland, OR (US); Mayank Gupta, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 63 days.

(21) Appl. No.: 11/236,967

(22) Filed: Sep. 27, 2005

(65) Prior Publication Data
US 2007/0090460 A1 Apr. 26, 2007

(51) Int. Cl.
*H01L 23/62* (2006.01)
(52) U.S. Cl. .................... 257/360; 257/361
(58) Field of Classification Search ........ 257/356, 257/360, 510, 361
See application file for complete search history.

(56) References Cited

U.S. PATENT DOCUMENTS

| 5,208,475 | A  | * | 5/1993  | Mortensen ........... 257/360 |
| 5,910,673 | A  | * | 6/1999  | Hsu et al. ........... 257/355 |
| 6,204,537 | B1 | * | 3/2001  | Ma .................. 257/360 |
| 6,670,678 | B2 | * | 12/2003 | Kojima .............. 257/355 |
| 7,067,887 | B2 | * | 6/2006  | Chang et al. ........ 257/360 |
| 7,323,752 | B2 | * | 1/2008  | Chu et al. .......... 257/360 |

* cited by examiner

*Primary Examiner*—Mark Prenty
(74) *Attorney, Agent, or Firm*—MacPherson Kwok Chen & Heid LLP

(57) ABSTRACT

Systems and methods are disclosed herein to provide improved electrostatic protection for electrical circuits. For example, in accordance with an embodiment of the present invention, an electrostatic protection device includes: a drain region formed in a substrate; a gate separated from the substrate by a gate oxide; and an isolation region formed in the substrate, the isolation region being adapted to isolate the gate oxide from a DC voltage coupled to the drain region.

11 Claims, 3 Drawing Sheets

ELECTROSTATIC PROTECTION SYSTEMS AND METHODS

TECHNICAL FIELD

The present invention relates generally to electrical circuits and, more particularly, to an improved electrical discharge (ESD) circuit.

BACKGROUND

Electrical circuits are often susceptible to damage by electrostatic discharge (ESD) currents resulting from unintended contacts with sources of excess electric charge. For example, a user charged with static electricity can discharge ESD currents into an unprotected circuit at potentials of kilovolts. Such ESD currents can be particularly harmful to circuits designed for low voltage applications.

Various techniques have been developed to reduce the potential damage caused by ESD currents. For example, FIG. 1 illustrates a cross-sectional view of a known electrostatic protection device design. As set forth in FIG. 1, an NMOS transistor 100 is provided on a p-doped substrate 150 and includes an n-doped drain region 110, an n-doped source region 120, and a conductive gate 130 isolated from substrate 150 by a gate oxide 135.

An input/output (I/O) pad 160 couples to drain region 110. A voltage source 175 coupled to pad 160 models the effect of a user charged with static electricity. The protective effect of NMOS transistor 100 with regard to voltage source 175 depends upon a "snapback" effect. In this effect, the high voltage from voltage source 175 induces an avalanche breakdown on the reverse-biased junction between drain region 110 and substrate 150. As a result, positive charge will accumulate in substrate 150 such that the junction between substrate 150 and source region 120 becomes forward-biased. In this fashion, a parasitic NPN bipolar transistor 180 (formed from drain region 110, substrate 150, and source region 120) conducts current from drain region 110 to source region 120 as a result of static electricity charging pad 160. In turn, because source region 120 and gate 130 are grounded, a channel 140 is induced in substrate 150 between drain region 110 and source region 120. In this fashion, current is rapidly drained from voltage source 175 into ground, thereby protecting the circuitry (not illustrated) that couples to pad 160.

Although NMOS transistor 100 thus functions as an ESD protection device, problems arise should pad 160 be coupled to an external DC voltage source (in contrast to the transient voltage source 175 arising from a static electricity charge). The DC voltage can overwhelm the thin gate oxide 135 found in today's smaller transistors. For example, in a 0.35 micron CMOS process, gate oxide 135 can only support a potential of 3.3 volts between gate 130 and substrate 150. Thus, should a relatively high DC voltage source such as 12 volts be coupled to pad 160, gate oxide 135 will fail.

An ESD protection approach that can withstand such relatively high voltages at pad 160 involves the use of a stacked circuit design in which several (e.g., three) MOS transistors are connected in series to spread the high voltage and associated stress across the several transistors. However, this approach can require increased chip area for implementation, and is complicated by the need for additional transistors.

Accordingly, there is a need for an improved approach to ESD protection that permits the handling of relatively-high DC voltages at the protected I/O pad without incurring excessive chip area demands.

SUMMARY

In accordance with one embodiment of the present invention, an electrostatic protection device includes: a drain region formed in a substrate; a gate separated from the substrate by a gate oxide; and an isolation region formed in the substrate, the isolation region being adapted to isolate the gate oxide from a DC voltage coupled to the drain region.

In accordance with another embodiment of the present invention, a method of manufacturing an electrostatic protection device includes: forming an isolation region in a substrate; forming a drain region in the substrate; and forming a gate oxide on the substrate, wherein the isolation region is adapted to isolate the gate oxide from a DC voltage coupled to the drain region.

In accordance with another embodiment of the present invention, an electrostatic protection device includes a drain region formed in a substrate; a gate separated from the substrate by a gate oxide; and means for isolating the gate oxide from a DC voltage coupled to the drain region.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

The various techniques disclosed herein are applicable to a wide variety of integrated circuits including but not limited to volatile and non-volatile memory circuits (e.g., flash memory devices or flash memory embedded within an integrated circuit) and applications.

Figure 1:
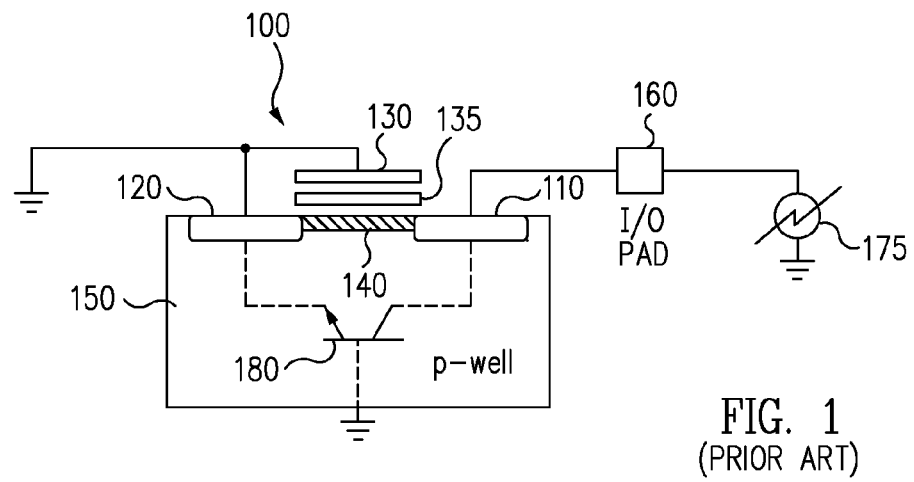
FIG. 1 illustrates a cross-sectional view of a known electrostatic protection device design.
Figure 2:
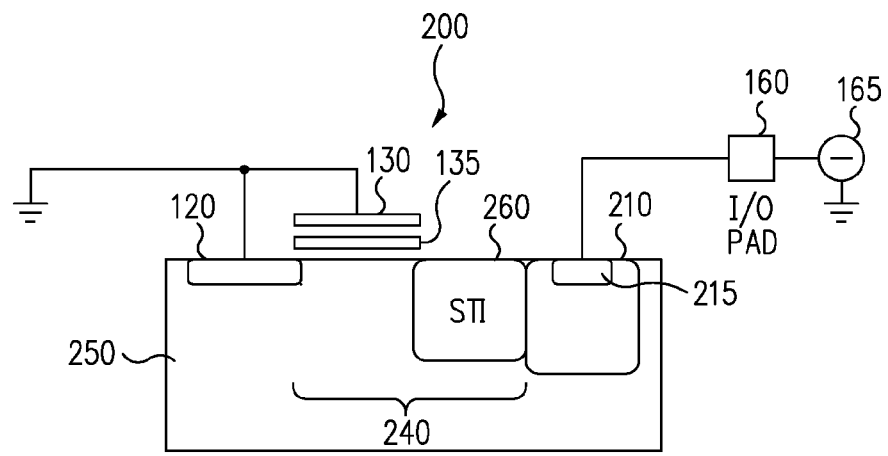
FIG. 2 illustrates a cross-sectional view of an electrostatic protection device in accordance with an embodiment of the present invention.

FIG. 2 illustrates a cross-sectional view of an electrostatic protection device formed from an NMOS transistor 200 in accordance with an embodiment of the present invention. NMOS transistor 200 is provided on a p-doped substrate 250 and include a source region 120, a gate 130, and gate oxide 135 as discussed with regard to FIG. 1. However, a drain region 210 is separated or spaced away from gate 130 by an isolation region 260. An I/O pad 160 couples to drain region 210. It will be appreciated, however, that drain region 210 may be coupled to other nodes of an integrated circuit requiring ESD protection.

Because isolation region 260 comprises a dielectric, it isolates drain region 210 from gate oxide 135. Thus, I/O pad 160 may be coupled to a continuous DC source 165 of relatively high voltage such as 13.6 volts without gate oxide 135 failing. In one embodiment, isolation region 260 may be implemented as a field oxide trench in accordance with a shallow trench isolation (STI) process. Although isolation region 260 prevents gate oxide 135 from failing in this fashion, the snapback effect discussed with regard to FIG. 1 should still be supported so that NMOS transistor 200 may couple ESD currents from drain region 210 to ground.

Operation of the snapback effect is hindered, however, by formation of isolation region 260. Thus, drain region 210 is bolstered by a deep, high dose implant of n-type dopant. Preferably, drain region 210 extends deeper than isolation region 260. For example, if isolation region 260 has a depth of 0.4 micron, drain region 210 is implanted to a depth of 0.5 micron. In one embodiment, drain region 210 may be implanted with an n-type dopant having a concentration of approximately $10^{15}$ per $cm^3$. Advantageously, such a deep, high dose implant may be used to form EEPROM cells. Thus, if the integrated circuit including NMOS transistor 200 already contains such EEPROM cells, no further masking or implant steps need be performed to form drain region 210.

Because drain region 210 is formed using a deep, high dose implant, it may couple electrically to gate 130 such that a channel 240 may be formed under gate 130 and isolation region 260 analogously as discussed with regard to NMOS transistor 100 of FIG. 1. Advantageously, NMOS transistor 200 thus supports snapback operation such that ESD currents may be dissipated through drain region 210 into ground despite the presence of isolation region 260. Moreover, I/O pad 160 may be coupled to relatively high sources of DC voltage without causing gate oxide 135 to fail.

Figure 3:
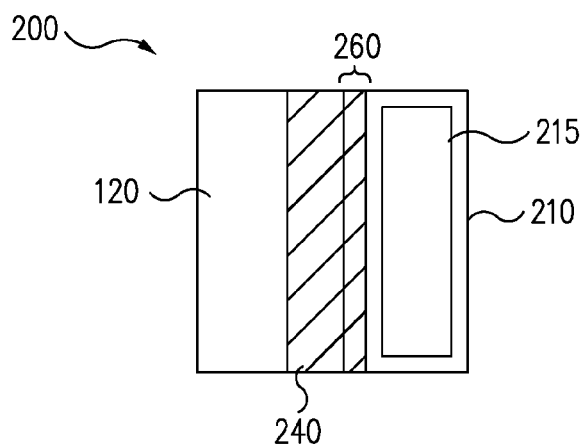
FIG. 3 illustrates a top view of an electrostatic protection device in accordance with an embodiment of the present invention.

FIG. 3 illustrates a top view of NMOS transistor 200 in accordance with an embodiment of the present invention. Channel region 240 and isolation region 260 are illustrated in FIG. 3 as having widths of approximately 0.850 μm and approximately 0.400 μm, respectively. Drain region 210 is additionally illustrated in FIG. 3 as having an active portion 215 resulting from the deep, high dose implant used to form drain region 210.

NMOS transistor 200 can be manufactured in accordance with various processing steps. For example, in one embodiment, isolation region 260 can be initially etched on substrate 250 and filled with a dielectric. A high dose implant of n-type dopant can then be provided to create the active portion 215 of drain region 210. Thereafter, conductive gate 130, gate oxide 135, source region 120, and the remainder of drain region 210 can be formed.

The operation of NMOS transistor 200 under ESD conditions will now be described with reference to FIG. 2. As discussed, drain region 210 can be coupled to a circuit node such as I/O pad 160. If an ESD current is received though such a node, an ESD hole current can flow into substrate 250 resulting from an avalanche breakdown of the reverse-biased junction between drain region 210 and substrate 250, causing the voltage of substrate 250 to increase relative to source region 120.

As discussed analogously with regard to NMOS transistor 100 of FIG. 1, the increased voltage of substrate 250 makes the junction between substrate 250 and source region 120 become forward biased. In this fashion, a parasitic NPN bipolar transistor (not illustrated) conducts ESD current from drain region 210, through substrate 250 and source region 120, and into ground such that snapback operation begins. As the ESD current flows into drain region 210, isolation region 260 will impede the current from flowing directly to a shallower channel region underneath gate oxide 130, thereby allowing the ESD current to flow from drain region 210 to source region 120 through deeper channel region 240. During snapback operation, the rapid increase in ESD current flow to the forward-biased p-n junction between channel region 240 and source region 120 results in a corresponding rapid fluctuation in the voltage on drain region 210.

Figure 4:
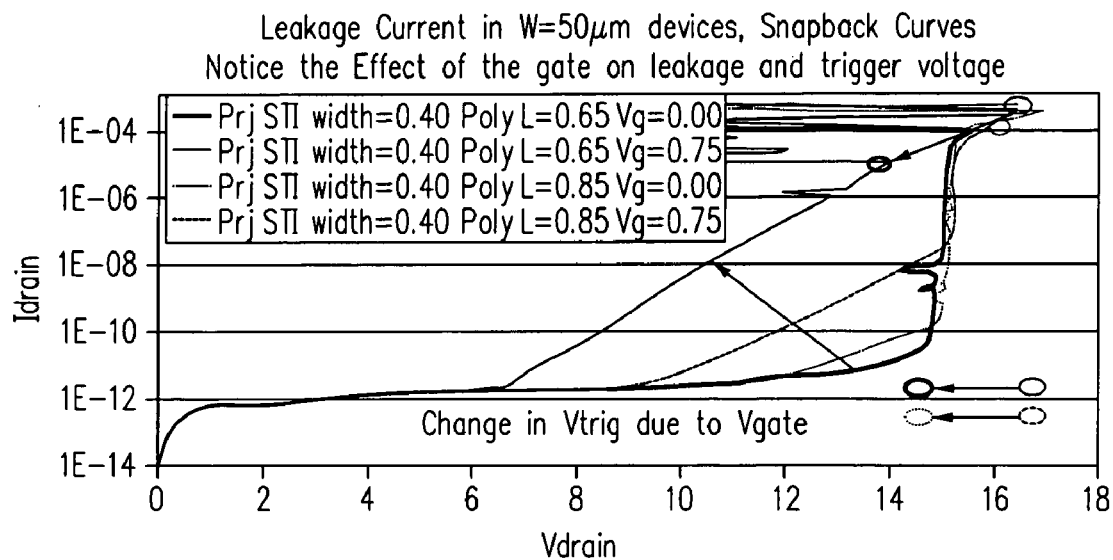
FIGS. 4 and 5 provide exemplary graphs illustrating snapback characteristics for electrostatic devices in accordance with various embodiments of the present invention.
Figure 5:
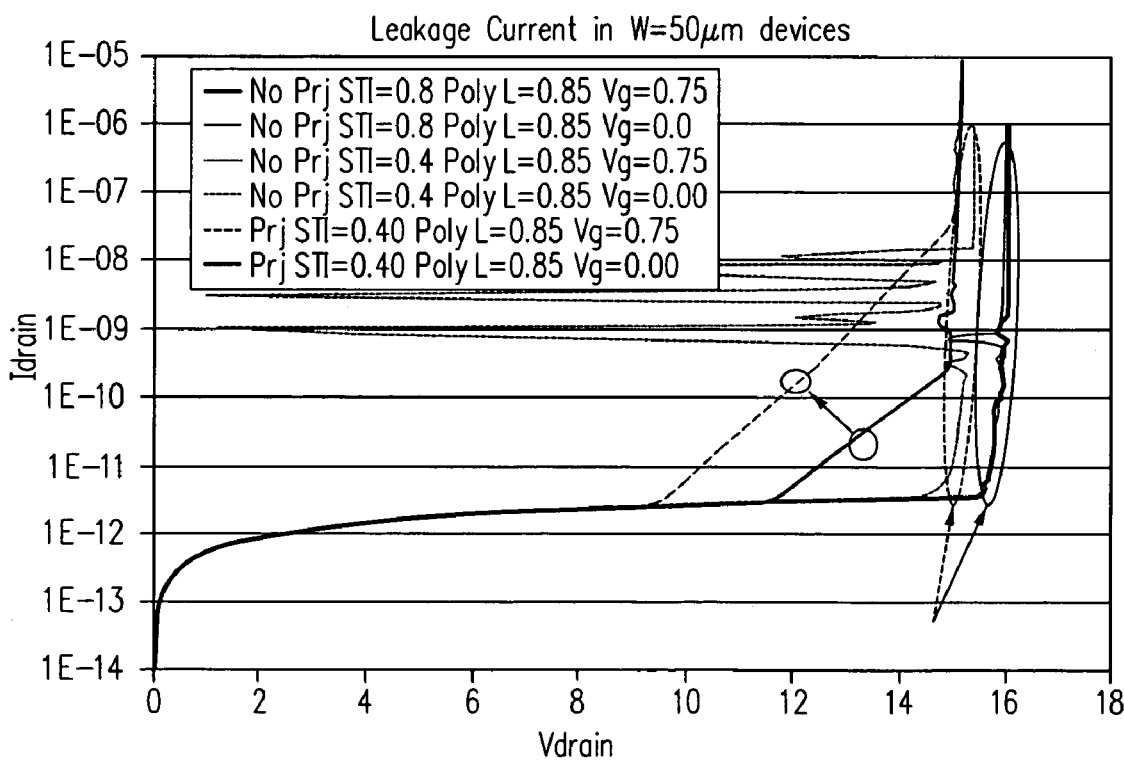

FIGS. 4 and 5 provide exemplary graphs illustrating snapback characteristics for electrostatic protection devices in accordance with various embodiments of the present invention. In that regard, rather than ground gate 130 as shown in FIG. 2, gate 130 may be biased. For example, FIG. 4 provides voltage-current plots for several variations of NMOS transistor 200 employing various lengths for channel region 240 and various bias voltages applied to gate 130. FIG. 5 provides voltage-current plots for several variations of NMOS transistor 200 with and without a deep, high dose implant in drain region 210, various widths of isolation region 260, and various bias voltages applied to gate 230.

From the plots of FIGS. 4 and 5, it will be appreciated that the voltage associated with drain region 210 at which NMOS transistor 200 enters snapback operation (i.e., trigger voltage, Vtrig) can be adjusted by selectively applying a bias voltage to gate 130. In particular, as the gate voltage (i.e., Vg, Vgate) increases, the trigger voltage decreases. In FIG. 4, it is apparent that as the width of channel region 240 decreases (i.e., Poly L), the trigger voltage also decreases. In FIG. 5, it is further apparent that the use of a deep, high dose implant for drain region 210 permits NMOS transistor 200 to conduct large amounts of ESD current at lower voltages of drain region 210.

By implementing drain region 210 with a deep, high dose implant, the snapback trigger voltage of NMOS transistor 200 can be selectively adjusted as a bias voltage is applied to gate 130. Specifically, the implant aids in the conduction of ESD current below isolation region 260. As indicated by the plots of FIGS. 4 and 5, the gate voltage, width of channel region 240, and depth of drain region 210 can affect the conduction of such current.

Figure 6:
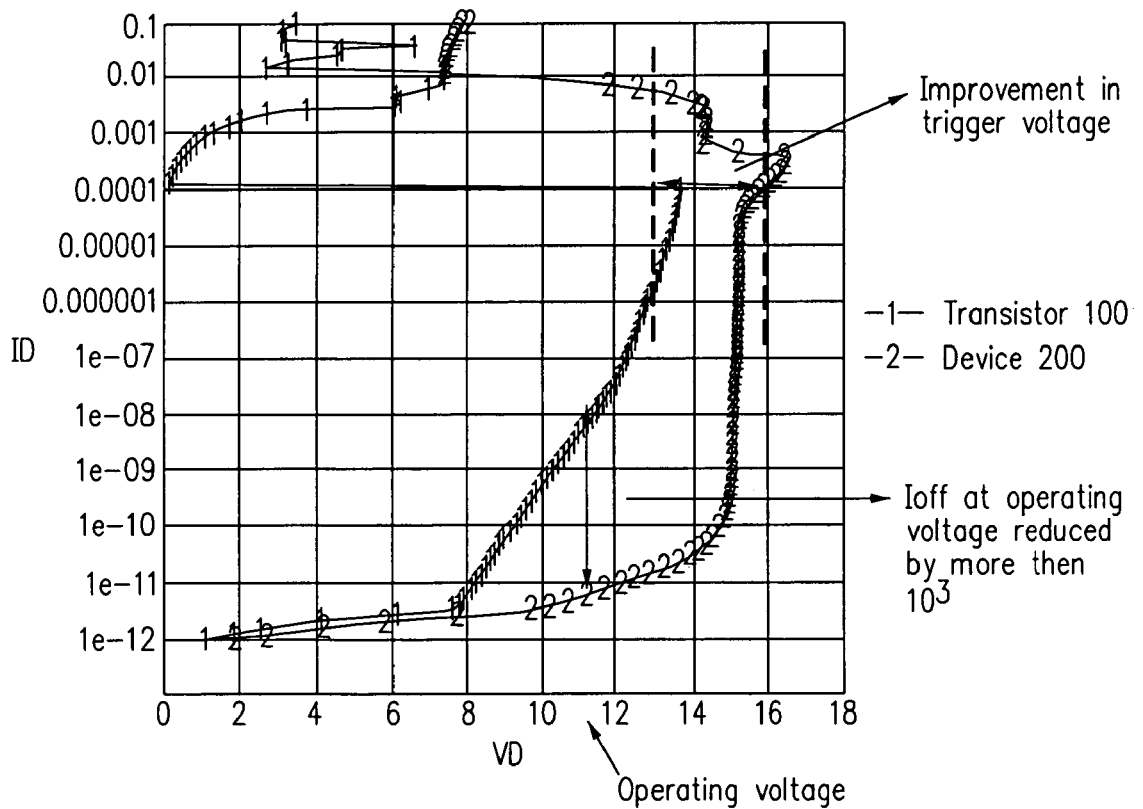
FIG. 6 provides an exemplary graph illustrating snapback characteristics for a known transistor design as well as an electrostatic device in accordance with an embodiment of the present invention.

FIG. 6 provides an exemplary graph illustrating a comparison of snapback characteristics for a known transistor design as well as an electrostatic protection device in accordance with an embodiment of the present invention. Specifically, FIG. 6 provides voltage-current plots comparing the operation of NMOS transistor 100 of FIG. 1 and NMOS transistor 200 of FIG. 2. As identified in FIG. 6, NMOS transistor 200 uses less current (i.e., exhibits low drain leakage current in the pA range) than NMOS transistor 100 at low operating voltages, but is also capable of handling higher voltages (for example, four times a 3.3 volt operating voltage of transistor 200) before entering snapback operation.

As evidenced by the plots of FIG. 6, isolation region 260 also causes drain region 210 to resist gate-aided junction breakdown with a steeper voltage ramp in comparison to the breakdown of drain region 110 for NMOS transistor 100. In particular, in the embodiment of FIG. 6, the breakdown voltage of NMOS transistor 200 can be approximately 3-4 volts higher then the gate aided junction breakdown of transistor 100 of FIG. 1.

Embodiments described above illustrate but do not limit the invention. For example, although various features have been described with reference to particular materials and doping, it will be appreciated that other implementations are also contemplated by the present disclosure. It should also be understood that numerous modifications and variations are possible in accordance with the principles of the present invention. Accordingly, the scope of the invention is defined only by the following claims.

We claim:

1. An electrostatic protection device comprising:
a drain region formed in a substrate;
a gate separated from the substrate by a gate oxide; and
a shallow trench isolation region formed in the substrate and adjacent to the drain region, the isolation region being adapted to isolate the gate oxide from a DC voltage coupled to the drain region, wherein the isolation region does not extend under the gate.

2. The electrostatic protection device of claim 1, wherein the drain region is at least as deep as the isolation region.

3. The electrostatic protection device of claim 1, wherein the drain region is formed using a high dose implant.

4. The electrostatic protection device of claim 1, wherein the electrostatic protection device is adapted to enter a snapback operation in response to coupling a source of electrostatic voltage to the drain region.

5. The electrostatic protection device of claim 1, wherein:
the electrostatic protection device is adapted to enter a snapback operation in response to coupling a source of electrostatic voltage to the drain region; and
the gate is adapted to receive a control voltage to adjust a trigger voltage associated with the snapback operation.

6. The electrostatic protection device of claim 1, wherein drain region comprises n-type material, and the substrate comprises p-type material.

7. The electrostatic protection device of claim 1, wherein the drain region is coupled to a pad of an integrated circuit.

8. The electrostatic protection device of claim 1, wherein the electrostatic protection device is provided in an integrated circuit.

9. The electrostatic protection device of claim 1, wherein the electrostatic protection device is a transistor.

10. An electrostatic protection device comprising:
a drain region formed in a substrate;
a gate separated from the substrate by a gate oxide; and
a shallow trench isolation region formed in the substrate and adjacent to the drain region, the isolation region being adapted to isolate the gate oxide from a DC voltage coupled to the drain region, wherein the isolation region does not extend under the gate and is between the drain region and the gate oxide.

11. The electrostatic protection device of claim 10, wherein the isolation region extends between the drain region and the gate oxide.

* * * * *